United States Patent [19]

Arumugham

[11] 4,027,252

[45] May 31, 1977

[54] TUNING VOLTAGE CIRCUIT

[75] Inventor: Rangaswamy Arumugham, Batavia, N.Y.

[73] Assignee: GTE Sylvania Incorporated, Stamford, Conn.

[22] Filed: Dec. 12, 1975

[21] Appl. No.: 640,010

[52] U.S. Cl. ............................. 325/464; 325/422
[51] Int. Cl.² ..................................... H03J 5/02
[58] Field of Search .................... 325/464, 422; 179/5.8 AF; 331/36 R, 36 C; 334/15

[56] References Cited

UNITED STATES PATENTS

| | | | |
|---|---|---|---|
| 3,528,043 | 9/1970 | Richter | 325/464 |
| 3,693,091 | 9/1972 | Russell | 178/5.8 AF |
| 3,824,507 | 7/1974 | Speer | 325/464 |
| 3,878,466 | 4/1975 | Henrickson | 325/464 |
| 3,906,351 | 9/1975 | Evans | 325/464 |
| 3,952,143 | 4/1976 | Siwko | 178/5.8 AF |

Primary Examiner—Harold I. Pitts
Attorney, Agent, or Firm—Norman J. O'Malley; Robert E. Walrath; Robert T. Orner

[57] ABSTRACT

A tuning voltage circuit for providing a tuning voltage which is corrected by an automatic frequency control error voltage for application to a voltage controlled radio frequency tuning means for a television receiver is shown. The voltage controlled radio frequency tuning means has a non-linear frequency versus tuning voltage characteristic which causes the sensitivity of the tuning means to the error voltage to vary over the frequency range of interest. The tuning voltage circuit includes a high impedance tuning voltage source which provides sensitivity compensation for the automatic frequency control error voltage to compensate for variations of the automatic frequency control pull-in range in the frequency range of interest.

11 Claims, 7 Drawing Figures

TUNING VOLTAGE CIRCUIT

CROSS REFERENCE TO RELATED APPLICATIONS

K. Siwko, "Wide Band AFC System," Ser. No. 563,578, filed Mar. 31, 1975, and R. Arumugham, "Signal Combining Circuit," Ser. No. 628,072, filed Nov. 3, 1975, now U.S. Pat. No. 3,952,143, both assigned to the same assignee as this application.

FIELD OF THE INVENTION

This invention relates to automatic frequency controlled tuning voltage generating circuitry for voltage controlled radio frequency tuning means in television receivers and more particularly to tuning voltage circuitry which compensates for varying sensitivity of the tuning means to an automatic frequency control voltage.

BACKGROUND OF THE INVENTION

In tuning systems of the type used in television receivers utilizing voltage controlled reactive elements as frequency determining components, the frequency of operation is typically determined by a variable bias voltage provided by, for example, a potentiometer. Typically, a plurality of potentiometers are provided with each potentiometer being set to provide the proper bias voltage for a respective channel. The voltage controlled frequency determining element or elements are typically diodes with voltage controllable capacitances such as varactor diodes. For reasons of economy it is generally desired to utilize a single diode or circuit arrangement for all of the frequencies in which received signals are expected. In the case of a VHF tuner received signals can be expected in any of channels 2-13, however, band-switching circuitry can be used to divide the operation between low-band and high-band VHF channels. In the case of a UHF tuner received signals can be expected in any of channels 14-83, and accordingly, the frequency of operation of the tuner must be variable over the entire UHF band which includes video carrier frequencies from 471.25 MHz to 885.25 MHz.

Typical tuners using varactor-type diodes require a substantial range of capacitance change of the varactor diode to cover the frequency range of interest. The capacitance characteristic of typical varactor diodes, however, is not linear with respect to the applied bias voltage. While this problem is not unduly limiting with respect to the applied tuning bias voltage, the automatic frequency control (AFC) of the tuner is deleteriously affected. The AFC circuit provides a given correction voltage for a given frequency deviation from the proper intermediate frequency. Since the varactor diode capacitance characteristic is non-linear, however, a given AFC correction voltage provides a differing amount of correction depending upon the bias voltage or channel received thereby resulting in a varying AFC pull-in range. For example, if the proper pull-in range is provided at the low-frequency channels in the band of interest, the pull-in range at the high frequency channels becomes insufficient. Conversely, if the proper or desired pull-in range is provided for the high frequency channels, the pull-in range at the low frequency channels become excessive which can lead to such deleterious effect as locking onto the associated sound carrier, locking onto adjacent channel carriers and similar problems.

Furthermore, it has been found that when the tuning voltage is derived from the tap of a potentiometer connected in parallel with a zener diode in accordance with a typical prior art technique, the output resistance of the tuning voltage source varies greatly over the frequency range of interest. It has been further found that in accordance with this prior art technique the variation in output resistance varies the AFC correction voltage in such a manner that the maximum correction is provided at approximately the midrange of the potentiometer while minimum correction is provided at the extremities of the tuning range. This means that at high frequency channels where the tuning sensitivity is lowest, the low output impedance of the tuning voltage source tends to shunt the AFC source to decrease the correction and the pull-in range for the high frequency channels.

Prior art attempts to solve the above-noted and other problems have resulted in added circuitry with attendant added complexity, lower reliability, and higher cost, as well as performance deficiencies. Furthermore, prior art techniques have generally been unsuccessful in solving the problem of providing substantially constant or compensated pull-in performance of the AFC system.

OBJECTS OF THE INVENTION

Accordingly, it is a primary object of this invention to obviate the above-noted and other disadvantages of the prior art.

It is a further object of this invention to provide a voltage controlled radio frequency tuning means and automatic frequency control system with enhanced performance capabilities.

It is a further object of this invention to provide a signal combining circuit for combining a tuning voltage and an AFC voltage.

It is a further object of this invention to provide a tuning voltage source which provides compensation for variations of the AFC pull-in range for a voltage controlled radio frequency tuner.

It is yet a further object of this invention to provide a signal combining circuit for combining a tuning voltage with an AFC error voltage to compensate for non-linearities of a voltage controlled radio frequency tuner.

It is a still further object of this invention to provide a tuning voltage circuit which combines a tuning voltage and an AFC error voltage to provide an automatic increase in AFC voltage applied to a voltage controlled radio frequency tuner with an increase in tuning voltage.

SUMMARY OF THE INVENTION

In one aspect of this invention the above and other objects and advantages are achieved in a television receiver having a voltage controlled radio frequency tuning means, automatic frequency control means for providing an error voltage, channel selection means for selecting a television channel to be received, and circuit means for providing a tuning voltage to the tuning means. The circuit means includes a source of energizing voltage, first and second resistance means connected in series with the source, variable means coupled to the first and second resistance means, and voltage combining means. The variable means varies the relative magnitudes of the first and second resistance means. The first resistance means has a large resistance relative to the maximum resistance of the second resistance means. The voltage combining means couples the variable means and the automatic frequency control means to an input of the tuning means for combining the error voltage with the voltage of the variable means.

BRIEF DESCRIPTION OF THE DRAWINGS

FIG. 7 is a block and schematic illustration of a television receiver incorporating the invention.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings.

While the invention will be described in connection with a UHF tuner in a television receiver, those skilled in the art will realize that the invention is not so limited. Specifically, those skilled in the art will realize that the invention can be applied to a VHF tuner to compensate for non-linearities over the VHF band or bands in a manner similar to that described herein.

Figure 1:
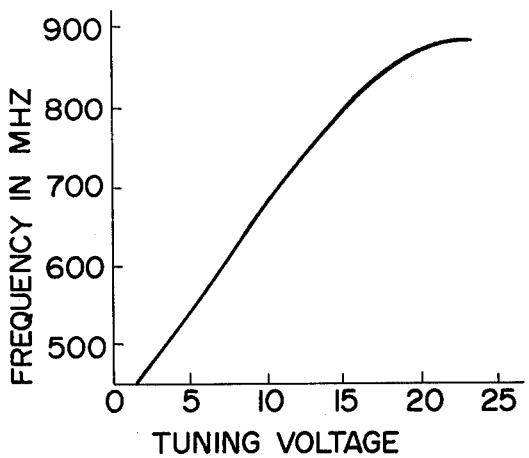
FIG. 1 is a plot of frequency versus tuning voltage for a typical voltage controlled tuner.

FIG. 1 is a plot of the frequency in MHz versus tuning voltage for a typical UHF voltage controlled radio frequency (RF) tuner of the type using varactor diodes as voltage dependent reactances. The plot of FIG. 1 covers the channel assignment for channels 14 through 83. It is evident from FIG. 1 that the change in frequency for a given change in tuning voltage varies widely over the frequency range of interest.

Figure 2:
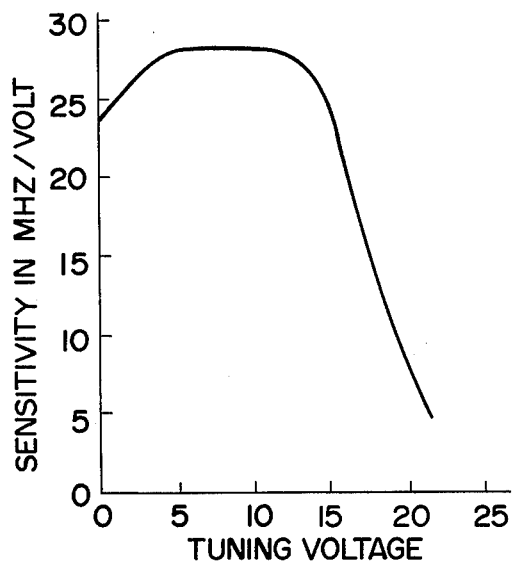
FIG. 2 is a plot of sensitivity versus tuning voltage for a typical voltage controlled tuner.

The non-linearity of the frequency change with respect to tuning voltage is further illustrated in FIG. 2 which is a plot of the sensitivity in MHz/volt versus tuning voltage as measured for a typical voltage controlled RF tuner. As is illustrated therein, the sensitivity varies over a range of about 5-to-1 in the frequency range of interest. The sensitivity is relatively high for low frequency channels and relatively low for high frequency channels so that a given change in tuning voltage has a differing effect depending upon the frequency of the signal being received.

Figure 3:
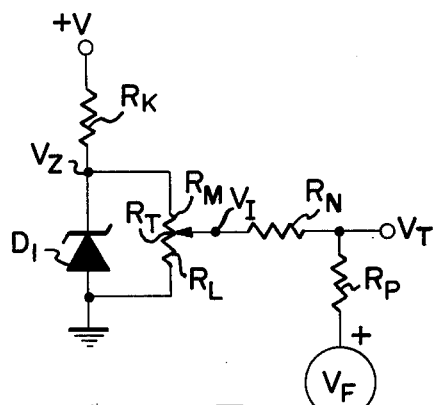
FIG. 3 is a schematic illustration of a typical prior art circuit for providing a tuning voltage and automatic frequency control error voltage.

FIG. 3 is a schematic illustration of a prior art circuit for providing a tuning voltage corrected by an automatic frequency control (AFC) voltage. In FIG. 3 a source of energizing voltage illustrated as a terminal +V is connected by a resistor $R_K$ and a zener diode $D_1$ to circuit ground. A resistance element $R_T$ of a potentiometer is connected in parallel with zener diode $D_1$. Zener diode $D_1$ operates in its reverse breakdown region to provide a voltage $V_Z$ across resistance element $R_T$. A voltage $V_I$ is developed at the tap of the potentiometer and can be increased or decreased by varying the tap on the potentiometer. Resistance element $R_T$ is further divided into portions $R_L$ between the tap and circuit ground and $R_M$ between the tap and junction $V_Z$ between resistor $R_K$ and zener diode $D_1$. The tap of the potentiometer is connected by a resistor $R_N$ to an input terminal $V_T$ of a voltage controlled RF tuner. An AFC source $V_F$ is connected by a resistor $R_P$ to the input terminal $V_T$ of the tuner. The tuning voltage, $V_T$, provided at input terminal $V_T$ is a combination of $V_I$ and $V_F$.

The resistance at the tap of the potentiometer is given by the equation:

$$R_I = R_L R_M / R_T = R_L (R_T - R_L)/R_T, \quad (1)$$

where the internal resistance of zener diode $D_1$ is negligible. The tap resistance, $R_I$, can also be expressed in terms of the voltages $V_I$ and $V_Z$:

$$R_I = (V_I R_T / V_Z)(1 - V_I / V_Z). \quad (2)$$

Figure 4:
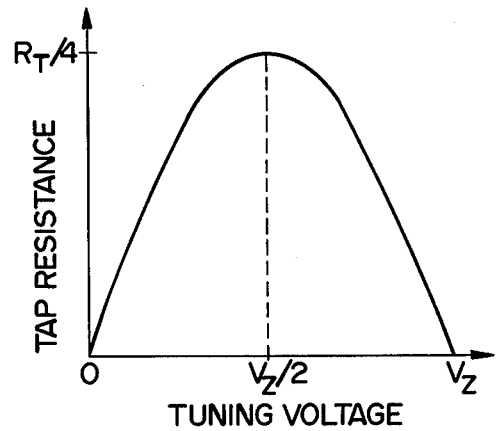
FIG. 4 is a plot of tap resistance versus tuning voltage for the prior art circuit of FIG. 3.

FIG. 4 is a plot of the tap or output resistance of a potentiometer as function of the tap voltage or tuning voltage. It is readily seen from equations (1) and (2) that the resistance $R_I$ is at a maximum when the tap is centered, that is, $R_L$ and $R_M$ are equal. When the potentiometer is adjusted from the mid-position for both low frequency and high frequency channels, that is, $V_I$ is increased or decreased, $R_I$ decreases from its maximum to a low level.

The output resistance at terminal $V_T$ is a parallel combination of resistor $R_P$ and $R_N$ in series with resistance $R_I$. The tuning voltage at terminal $V_T$ is given by the equation:

$$V_T = \frac{V_I R_P}{R_I + R_N + R_P} + \frac{V_F(R_I + R_N)}{R_I + R_N + R_P}, \quad (3)$$

where the first term is the contribution due to $V_I$ and the second term is the AFC correction voltage, $V_C$. It is evident from equation (3) that the AFC correction voltage, $V_C$, is dependent upon the magnitude of $R_I$. Specifically, when channels in the high or low end of the band are tuned in, $R_I$ is decreased from its maximum value, and the correction voltage, $V_C$, also decreases. Since the error voltage, $V_F$, is derived from the frequency error of the signal in the intermediate frequency (IF) amplifier, the magnitude of $V_F$ for a given frequency error will be the same across the frequency range of interest. The pull-in range of the AFC system is dependent upon the correction voltage, $V_C$, however, so that the pull-in range varies across the RF frequency range of interest. Specifically, the tuner sensitivity is lowest for signals in channels at the high end of the frequency range while the correction voltage, $V_C$, is also decreased for those signals. Accordingly, the combination of tuner sensitivity and response to the error voltage combine to provide a substantial change in pull-in range over the frequency range of interest. In practical prior art AFC systems, it has been found that the pull-in range of the AFC system will vary as much as 4-to-1 over the UHF frequency band when the tuning voltage is provided by a circuit such as that illustrated in FIG. 3.

Figure 5:
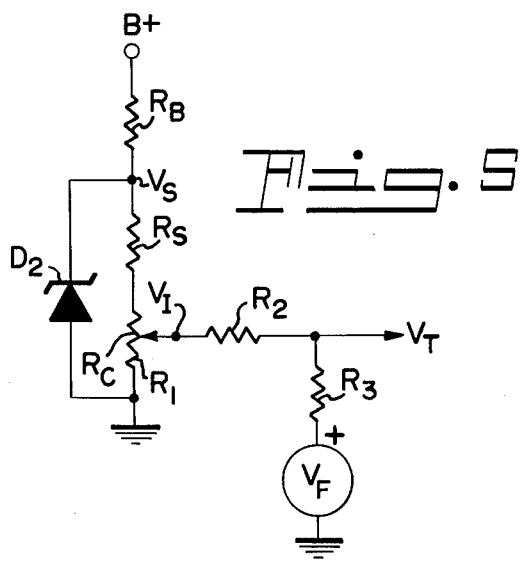
FIG. 5 is a schematic illustration of a circuit embodying the invention.

FIG. 5 is a schematic illustration of a circuit means for providing a tuning voltage to a tuning means in accordance with the invention. In FIG. 5 a source of energizing voltage illustrated as a terminal B+ is connected by a resistor $R_B$ to a junction $V_S$. The source of energizing voltage includes a voltage reference means illustrated as a zener diode $D_2$ connected between junction $V_S$ and circuit ground. Junction $V_S$ is further connected by first and second resistance means illustrated as a resistor $R_S$ connected in series with a resistance element $R_C$ of a potentiometer to circuit ground. Resistance element $R_C$ has a first resistance portion between a variable means illustrated as a tap of the potentiometer and the end of resistor $R_S$ and a second resistance portion $R_1$ between the tap and circuit ground. The tap comprises a means for varying the relative magnitudes of the first and second resistance means.

A tuning bias voltage, $V_I$, is developed at the tap of the potentiometer. The tap is connected by a resistance means illustrated as a resistor $R_2$ to an input of a voltage controlled radio frequency tuning means illustrated as a terminal $V_T$. An automatic frequency control means illustrated as a voltage $V_F$ is connected between circuit ground and one end of a resistance means illustrated as a resistor $R_3$. The other end of resistor $R_3$ is connected to terminal $V_T$. Resistors $R_2$ and $R_3$ comprise a voltage combining means for combining the tuning bias voltage, $V_I$, with the AFC error voltage, $V_F$, to provide a tuning voltage, $V_T$, at terminal $V_T$.

Resistor $R_S$ has a large resistance relative to the maximum resistance of $R_1$ between the tap of the potentiometer and circuit ground. The resistance at the tap of the potentiometer is given by:

$$R_I = R_1(R_S + R_C - R_1)/(R_S + R_C). \quad (4)$$

Figure 6:
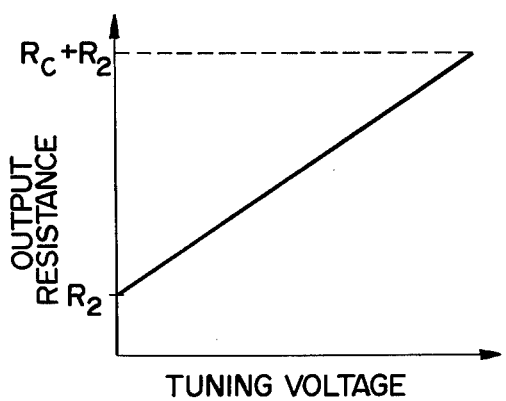
FIG. 6 is a plot of output resistance versus tuning voltage to aid in explaining the operation of the invention.
Figure 2:
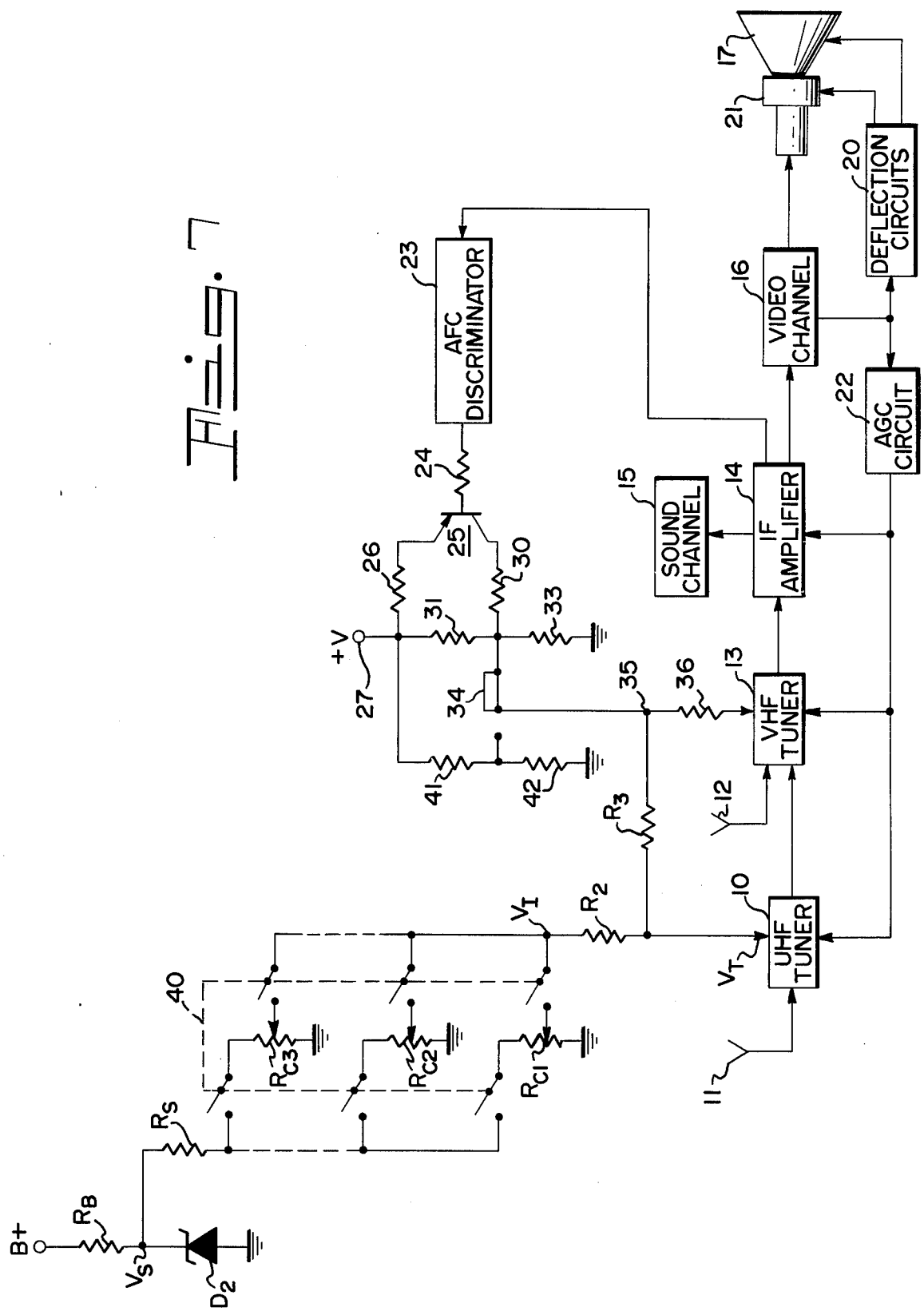

Preferably, however, the resistance of $R_S$ is at least ten times the maximum resistance of $R_1$ so that equation (4) can be approximated by $R_I = R_1$, that is, the resistance of resistor $R_S$ is sufficiently large so that it has negligible effect on the resistance at the tap of the potentiometer. Thus, the output resistance of the tuning voltage source is essentially the series combination of $R_1$ and $R_2$. FIG. 6 illustrates the generally linear variation in output resistance at terminal $V_T$ with variations in the tap voltage $V_I$. Specifically, the minimum resistance looking from terminal $V_T$ is $R_2$ if $R_1$ is decreased to zero. As $R_1$ is increased in magnitude, indicating increasing tuning voltage and tuning to higher frequency channels, the output resistance increases to a maximum of $R_C + R_2$. The increase is in a generally linear manner.

The voltage $V_S$ must be sufficiently large so that the voltage $V_I$ at the tap of the potentiometer can attain a magnitude sufficient to tune the tuner to the highest frequency channel within the frequency range of interest. Since, in practical circuits, $V_S$ may be quite large, zener diode $D_2$ can be a plurality of zener diodes rather than the illustrated single device. Furthermore, other voltage reference means for providing a constant voltage across resistor $R_S$ and resistance element $R_C$ can be substituted for zener diodes.

The tuning voltage, $V_T$, provided at terminal $V_T$ is given by:

$$V_T = \frac{V_I R_3}{R_1 + R_2 + R_3} + \frac{V_F(R_1 + R_2)}{R_1 + R_2 + R_3}, \quad (5)$$

where the first term is due to the contribution of the tuning bias voltage, $V_I$, and the second term is the AFC correction voltage, $V_C$, due to the AFC error voltage, $V_F$. It is readily seen that the correction voltage, $V_C$, increases when $R_1$ increases indicating tuning to higher frequency channels. As was noted above, the sensitivity of the tuner decreases for higher frequency channels thereby decreasing the pull-in range for a given correction voltage. The correction voltage, $V_C$, increases, however, to offset or compensate for the decreasing sensitivity. By proper selection of circuit components, substantially complete compensation can be provided to provide a sufficiently constant pull-in range over the frequency range of interest for practical purposes.

In practical circuits the resistance of resistor $R_3$ is preferably large relative to the resistance of $R_1$ and $R_2$ so that equation (5) can be approximated by:

$$V_T = V_I + V_F(R_1 + R_2)/R_3. \quad (6)$$

This equation more readily shows the increasing correction voltage, $V_C$, with increasing magnitude of $R_1$. Preferably the resistance of resistor $R_3$ is at least ten times the maximum resistance of $R_1$ plus $R_2$.

It should be noted that certain modifications will be evident to those skilled in the art. For example, resistor $R_S$ and resistance element $R_C$ can be combined in a single resistance with the range of values of $R_1$ restricted such that $R_1$ is always of sufficiently small magnitude such that equation (4) can be approximated by $R_I = R_1$.

FIG. 7 illustrates the embodiment of FIG. 5 incorporated in a typical television receiver. The television receiver includes a voltage controlled RF tuning means illustrated as a UHF tuner 10. A signal receiving means illustrated as an antenna 11 couples received television signals to UHF tuner 10. Another signal receiving means illustrated as an antenna 12 couples received television signals to a tuning means illustrated as a VHF tuner 13. An output of UHF tuner 10 is connected to VHF tuner 13 in accordance with the usual practice wherein the VHF tuner operates as an IF amplifier for UHF reception. An output of VHF tuner 13 is connected to an IF amplifier 14 which provides the sound portion of the received signal to a sound channel 15 and the video portion to a video channel 16.

Video channel 16 includes luminance circuitry, and in the case of a color television receiver, chrominance circuitry. Video channel 16 provides one or more signals to a display device illustrated as a cathode ray tube (CRT) 17. At least the synchronizing pulse portion of the received video signal is coupled to deflection circuits 20 which provide the usual vertical and horizontal deflection signals to a deflection yoke 21 associated with CRT 17. The high voltages necessary for the operation of CRT 17 are also derived from deflection circuits 20. A signal representative of the magnitude of the received television signals, such as the synchronizing pulses, is coupled to an AGC circuit 22 which provides the usual AGC signals to UHF tuner 10, VHF tuner 13, and IF amplifier 14.

An IF carrier is coupled from IF amplifier 14 to an AFC discriminator 23 in the usual manner. AFC discriminator 23 provides a signal indicative of the deviation of the IF carrier frequency from the desired IF carrier frequency. This signal, which is generally a voltage level is coupled via a resistor 24 to a base of a PNP transistor 25. Transistor 25 has an emitter connected by a resistor 26 to a source of energizing potential illustrated as a terminal 27. A collector of transistor 25 is connected by a resistor 30 in series with a resistor 31 to source 27. A resistor 33 is connected from the junction of resistors 30 and 31 to circuit ground. The junction of resistors 30, 31 and 33 is connected by switch 34 to a junction 35. Accordingly, components numbered from 23 to 35 correspond to AFC means $V_F$ of FIG. 5 and provide an error voltage, $V_F$, at junction 35.

Junction 35 is connected by a resistor 36 to an AFC input of VHF tuner 13. VHF tuner 13 can be a voltage controlled radio frequency tuning means in which case resistor 36 can correspond to resistor $R_3$ and the input of VHF tuner 13 can correspond to terminal $V_T$ of FIG. 5. While the invention is not illustrated in FIG. 7 as being used with VHF tuner 13, those skilled in the art will appreciate that it can be so used.

The various circuit components of FIG. 7 which correspond to components of FIG. 5 are identified by the same reference symbols. The single potentiometer including resistance element $R_C$ is replaced by a plurality of potentiometers in FIG. 7 of which the resistance elements $R_{C1}$, $R_{C2}$, and $R_{C3}$ are illustrated. Channel selection means 40, illustrated as a ganged switching means, discretionarily connects one of resistance elements $R_{C1}$, $R_{C2}$, and $R_{C3}$ in series with resistor $R_S$ and connects the tap of the same potentiometer to terminal $V_I$. Terminal $V_T$ is connected to an input of UHF tuner 10 to provide the tuning voltage, $V_T$, thereto. The channel selection means 40 includes ganged switches in the usual manner so that only one pair of the switches is closed at any one time to connect only one of the potentiometers in the circuit. The particular potentiometer selected, of course, corresponds to the particular television channel to be received.

The potentiometers are individually adjustable so that each potentiometer can be adjusted to provide the tuning voltage for any one of the UHF television channels. While three potentiometers and pairs of switches are illustrated, in practice the number of potentiometers and pairs of switches can be any number desired.

A pair of series connected resistors 41 and 42 are connected between source 27 and circuit ground with the junction therebetween connected to a terminal of switch 34. When the tuning potentiometers are being adjusted, switch 34 connects the junction of resistors 41 and 42 to junction 35 so that the AFC error voltage does not affect the adjustment of the potentiometers.

The operation of the invention illustrated in FIG. 7 is the same as that described for FIG. 5 since only one of the potentiometers is connected in the circuit by channel selection means 40 at any one time. Also, the various modifications described in connection with FIG. 5, the others which will be evident to those skilled in the art, can be incorporated into FIG. 7 as well.

Accordingly, there has been shown and described circuit means for providing a tuning voltage which includes a tuning voltage source and an AFC correction means. The tuning voltage source has resistance values such that compensation for varying pull-in ranges and tuner sensitivities is obtained over the range of frequencies of interest. Circuitry in accordance with the invention simply, inexpensively, and reliably compensates for variations in the pull-in range of the AFC system by automatically increasing the AFC voltage applied to the tuner when the tuning voltage is increased.

While there has been shown and described what is at present considered the preferred embodiment of the invention it will be obvious to those skilled in the art that various changes and modifications may be made therein without departing from the invention as defined by the appended claims.

What is claimed is:

1. In a television receiver having a voltage controlled radio frequency tuning means, automatic frequency control means for providing an error voltage, and channel selection means for selecting a television channel to be received, circuit means for providing a tuning voltage to said tuning means comprising:
   a source of energizing voltage;
   first and second resistance means connected in series with said source;
   variable means coupled to said first and second resistance means for varying the relative magnitudes of said first and second resistance means, said first resistance means having a large resistance relative to the maximum resistance of said second resistance means; and
   third and fourth resistance means connected in series between said variable means and said automatic frequency control means with a junction between said third and fourth resistance means being connected to the input of said tuning means, said fourth resistance means having a large resistance relative to the resistance of said second and third resistance means.

2. Circuit means for providing a tuning voltage as defined in claim 1 wherein said second resistance means is a portion of the resistance element of a potentiometer and said variable means is the tap of said potentiometer.

3. Circuit means for providing a tuning voltage as defined in claim 1 wherein the resistance of said first resistance means is at least ten times the maximum resistance of said second resistance means and the resistance of said fourth resistance means is at least ten times the sum of the resistances of said second and third resistance means.

4. Circuit means for providing a tuning voltage as defined in claim 3 wherein said source of energizing voltage includes a zener diode connected in parallel with said first and second resistance means.

5. Circuit means for providing a tuning voltage as defined in claim 1 wherein said source of energizing voltage includes voltage reference means connected in parallel with said first and second resistance means for providing a constant voltage thereacross.

6. Circuit means for providing a tuning voltage as defined in claim 5 wherein said voltage reference means includes a zener diode.

7. In a television receiver having a voltage controlled radio frequency tuning means, automatic frequency control means for providing an error voltage, and channel selection means for selecting a television channel to be received, circuit means for providing a tuning voltage to said tuning means comprising:
   a source of energizing voltage including voltage reference means for providing a constant voltage thereacross;
   a plurality of first and second resistance means each having a corresponding variable means for varying the relative magnitudes of said first and second resistance means, each of said first resistance means having a large resistance relative to the maximum resistance of the corrresponding one of said second resistance means;

third resistance means connected to an input of said tuning means for providing a voltage thereto, said channel selection means for discretionarily connecting particular pairs of said first and second resistance means in series with said source and across said voltage reference means and the corresponding one of said variable means to said third resistance means for coupling the voltage at said corresponding one of said variable means to said input of said tuning means; and fourth resistance means connected from said automatic frequency control means to said input of said tuning means for coupling said error voltage to said input, said fourth resistance means having a large resistance relative to the resistance of said third resistance means and each of second resistance means.

8. Circuit means for providing a tuning voltage as defined in claim 7 wherein each of said second resistance means is a portion of the resistance element of a potentiometer and the corresponding one of said variable means is the tap of said potentiometer.

9. Circuit means for providing a tuning voltage as defined in claim 8 wherein each of said first resistance means includes a resistor and the remaining portion of the resistance element of the corresponding potentiometer.

10. Circuit means for providing a tuning voltage as defined in claim 7 wherein the resistance of each of said first resistance means is at least ten times the maximum resistance of the corresponding one of said second resistance means and the resistance of said fourth resistance means is at least 10 times the sum of the resistance of said third resistance means and the maximum resistance of each of said second resistance means.

11. Circuit means for providing a tuning voltage as defined in claim 7 wherein said voltage reference means includes a zener diode.

* * * * *